United States Patent [19]

Leech

[11] Patent Number: 4,522,850

[45] Date of Patent: Jun. 11, 1985

[54] POLYMERIC SUBSTRATES FOR ELECTROLESS METAL DEPOSITION

[75] Inventor: Edward J. Leech, Oyster Bay, N.Y.

[73] Assignee: Kollmorgen Technologies Corporation, Dallas, Tex.

[21] Appl. No.: 365,476

[22] Filed: Apr. 5, 1982

Related U.S. Application Data

[60] Continuation of Ser. No. 800,939, May 26, 1977, abandoned, which is a division of Ser. No. 598,770, Jul. 25, 1975, abandoned.

[51] Int. Cl.$^3$ ............................ B05D 3/10; C23C 3/02
[52] U.S. Cl. ................................... 427/304; 156/307.1; 156/307.5; 156/307.7; 427/305; 427/306; 427/307; 427/404; 427/407.1
[58] Field of Search .................................. 427/304–307, 427/404, 407.1; 260/836, 837; 156/307.1, 307.7, 307.5

[56] References Cited

U.S. PATENT DOCUMENTS

| | | | |
|---|---|---|---|
| 1,869,021 | 12/1969 | Sutherland | 427/404 |
| 3,226,256 | 12/1965 | Schneble et al. | 427/306 |
| 3,686,359 | 8/1972 | Soldatos et al. | 427/306 |
| 3,925,138 | 12/1975 | Shaul et al. | 427/307 |

Primary Examiner—John D. Smith
Assistant Examiner—Janyce A. Bell
Attorney, Agent, or Firm—Morgan, Finnegan, Pine, Foley & Lee

[57] ABSTRACT

New polymeric substrates for the electroless deposition of metal thereon. The substrates of the invention result from the polymerization of liquid mixtures comprising a liquid precursor of a polymer that is relatively susceptible to oxidative attack and a liquid precursor of a polymer that resists oxidation.

14 Claims, 8 Drawing Figures

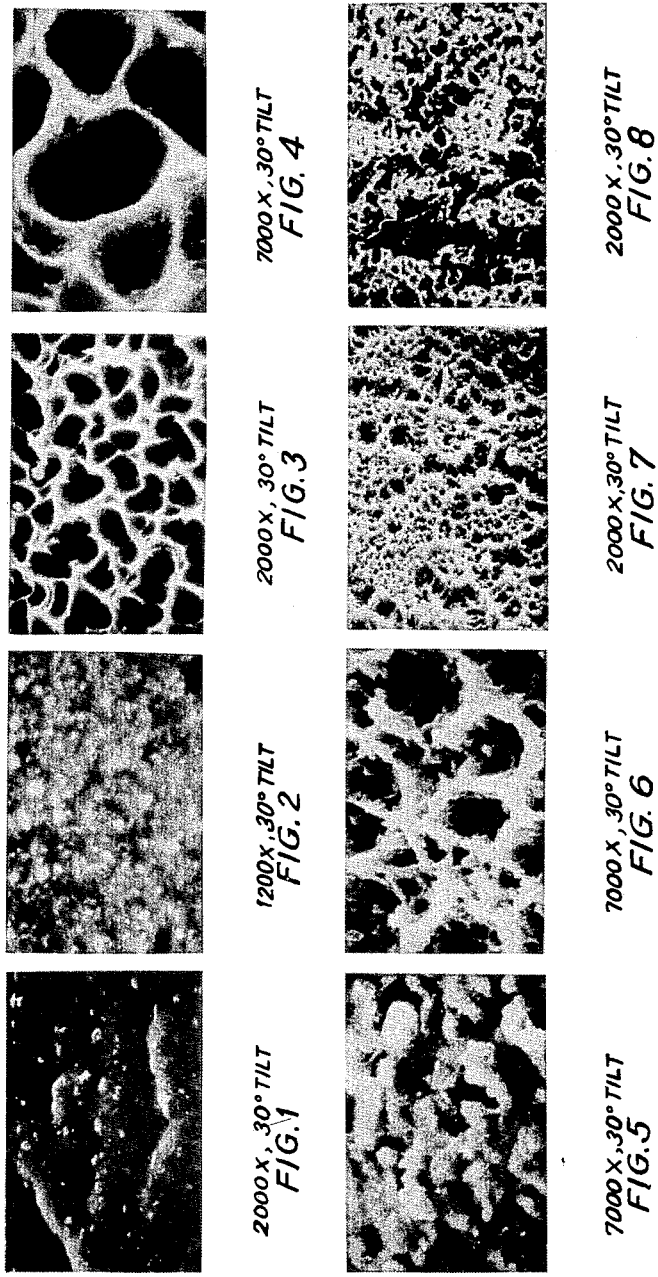

POLYMERIC SUBSTRATES FOR ELECTROLESS METAL DEPOSITION

CROSS-REFERENCE TO RELATED APPLICATIONS

This application is a continuation of application Ser. No. 800,939, filed May 26, 1977 (now abandoned), which in turn is a division of application Ser. No. 598,770, filed July 25, 1975 (now abandoned).

Organic coatings and materials whose surfaces may be provided with electroless metal deposits having commercially acceptable adhesion, that is, peel strengths of at least seven pounds per inch of width, have heretofore fallen into two distinct categories according to the method of preparing them and the requisite chemical treatment for insuring sufficiently adherent electroless metal plating on them.

A first type includes such products as platable grades of ABS and polypropylene, the adhesives disclosed in U.S. Pat. No. 3,625,758, the disclosure of which is hereby incorporated by reference, and epoxy/phenolic blends with polybutadiene, such as the Beiresdorf technical materials. Materials of this first type typically contain a dispersed phase of butadiene or acrylonitrile butadiene agglomerates within a matrix of materials such as epoxy/phenolic blends. The material of the dispersed phase of such substrates is readily degraded by oxidizing agents, such as chromic or permanganate solutions, while the matrix phase is less reactive to such agents. Following chromic or permanganate treatment, the substrate surface is microporous, resulting in greatly increased surface area, and is suitable for further processing in known electroless metal plating procedures.

Substrates of this type, i.e., heterogeneous, dispersed phase-matrix phase materials, have previously been prepared by masticating prepolymer of the dispersed or reactive phase material in solvent down to the desired molecular weight or chain length, and then blending the masticated prepolymer with the continuous phase or matrix phase materials in copious amounts of solvent. Such substrate materials normally comprise from 65 to 80 weight percent solvent prior to their application to base substrates as coatings, and, following solvent evaporation, typically comprise about 60 weight percent of unsaturated rubber as the dispersed phase and about 40 weight percent of a thermosetting plastic matrix.

A second general type of resinous substrates, such as epoxy and polysulfone, includes materials having an otherwise homogeneous single phase but with areas of differing crosslink density. Forming a microporous surface on such substrates requires a mandatory step preceding oxidation: polar and strained sites that are selectively attacked in the oxidation step must be created, usually by contacting the homogeneous substrate with a strong organic solvent, to permit preferential attack at areas having a lower density of crosslinks.

It is the object of this invention to provide improved processes for forming substrates for adherent metallization and improved substrates for the electroless deposition of metals thereon.

It was believed that if a diphase material could be formed as a result of micro phenomena, rather than as a result of physically masticating prepolymer of a degradable material and then effecting a dispersion of this material in a matrix of a second material by blending, the diphase material would be more uniform and the process for making it would be more efficient.

Polymers having ethylenic unsaturation, i.e., double bonds that are not of the resonant or benzene-type and that will participate in chemical reactions in a fashion analogous to the double bond in ethylene, are relatively susceptible to oxidative degradation, especially compounds having conjunction double bonds. Polymers having essentially no ethylenic unsaturation are relatively resistant to oxidation. According to the invention, totally liquid mixtures having at least two liquid constituents are polymerized to yield a diphase polymer, with at least one of the constituents being a liquid precursor of a polymer having ethylenic unsaturation and with at least one liquid precursor of a polymer having essentially no ethylenic unsaturation.

The precise form of the liquid precursors is not critical. Thus, they may be monomeric, dimeric, or even longer in chain length, so long as they remain liquid, will form the requisite mixtures with each other, and will polymerize to yield diphase polymers according to the invention.

As detailed below, liquid mixtures of the sort just described may be polymerized to yield materials that comprise a dispersed phase rich in polymer having ethylenic unsaturation and a continuous phase rich in polymer having essentially no ethylenic unsaturation, with a polymer having conjugated double bonds being preferred for the dispersed phase. When such a polymeric material is contacted in known fashions with, for example, chromic or permanganate solutions, the portions rich in ethylenic unsaturation are preferentially attacked and degraded, resulting in a microporous structure interconnected by portions rich in polymer having essentially no ethylenic unsaturation.

Substrates according to the invention include surfaces of the heterogeneous type, some of which require only oxidative treatment to increase the surface area of the substrate by rendering it microporous and some of which require pre-treatment with an organic solvent.

A heterogeneous, dispersed phase-matrix phase type of substrate may be obtained as described herein with the following advantages over the previously known heterogeneous substrates: no tedious and energy-consuming mastication and blending procedures are required and far less solvent is necessary, thereby decreasing cost, energy consumption in meeting drying requirements, and waste of materials.

Whether heterogeneous substrates requiring only oxidation treatment to render the surfaces microporous are desired or those requiring pretreatment with an organic solvent prior to oxidation are preferred, substrates resulting from processes described below are generally obtained in a more efficient fashion than previously known substrates and impart enhanced properties to finished metallized articles.

In a preferred embodiment of the invention, heterogeneous surfaces comprising an unsaturated rubber-rich phase dispersed in a continuous phase of thermosetting resin are formed by taking advantage of micro phenomena, rather than by effecting a physical dispersion as in the previously known process. A totally liquid mixture is formed of at least two constituents: one of the two minimum ingredients must be a liquid which, upon polymerization, will yield an unsaturated rubber susceptible to oxidative degradation; the other minimum ingredient must be a liquid which, upon polymerization, will yield a thermosetting resin that is relatively impervious to oxidation. And finally, the liquid mixture must, upon polymerization, result in separation of the two polymer products to a sufficient extent to form a diphase solid consisting of a dispersed phase rich in unsaturated rubber and a continuous phase rich in resin.

In order to provide a suitable platable surface for the deposition of electroless metal, it is also necessary that the resultant surface be adherent to the metal. And if the overall objective is the formation of printed circuit boards, the final product having the metallized surface must be capable of high temperature performance, for example to permit soldering operations.

Experimental work specifically directed to the use of the invention in making printed circuit boards has demonstrated that the preferred embodiment may be achieved by using as one component a highly polar liquid precursor that will polymerize to yield a rubber having ethylenic unsaturation and a highly functional liquid precursor of a thermosetting resin as a second component. As a general rule, it has been found that combinations of lower polarity unsaturated rubber precursors and low functionality resin precursors lead to polymer products exhibiting unreliable adhesion to electroless metal or inferior high temperature performance, rendering them unsuitable in printed circuit applications. Combinations of lower polarity unsaturated rubber precursors and resin precursors of high functionality tend to result in a lack of compatibility of the two components, which is usually manifested by unacceptable separation.

I have found that certain liquid mixtures comprising liquid carboxyl-terminated acrylonitrile butadiene, having also carboxyl groups randomly dispersed along the chain length or amine-terminated acrylonitrile butadiene, such as B. F. Goodrich's ATBN; highly functional liquid epoxides, such as epoxy novalacs or cycloaliphatic epoxies or mixtures thereof; and, optionally, liquid phenolic novalac yield, upon polymerization, improved resinous surfaces for later adherent metallization in electroless metal deposition baths.

The figures are scanning electron microscope photomicrographs obtained at the magnification and tilt indicated for each specimen and illustrate the grain structures, or surface characteristics, of the substrates.

FIG. 1 shows an untreated, heterogeneous substrate according to the invention;

FIG. 2 is a photomicrograph of a preferred prior art heterogeneous substrate, also untreated;

FIGS. 3 and 4 illustrate a FIG. 1 surface following chromic treatment in the known fashion;

FIG. 5 is a FIG. 2 surface following chromic oxidation;

FIGS. 6 and 7 are FIG. 1 surfaces following oxidative attack by contacting with permanganate solution; and FIG. 8 is a FIG. 2 surface that has been permanganate treated.

The content of the carboxyl acrylonitrile butadiene in the liquid mixture may vary from about 45 to about 65 weight percent of the mixture. Significantly more than 65 weight percent generally results in a polymer that is overly rubbery and weak. Significantly less than 45 weight percent content renders the resultant polymers almost totally resistant to oxidation agents presently preferred by practitioners. The preferred content of this component is from about 50 to about 60 weight percent.

The highly functional epoxy content of the liquid mixture may range from about 20 to about 40 weight percent. Suitable epoxies include liquid epoxy novolacs and liquid cycloaliphatic epoxies having a high functionality, or mixtures of such epoxies.

Phenolics may optionally be included in the liquid mixture. A preferred liquid phenolic resin is phenolic novolac, and it may be present in amounts ranging from zero to about 35 weight percent.

Utilization of the liquid mixtures described to form resinous surfaces for adherent metallization requires their polymerization. This is preferably achieved through the addition of a catalyst, curative, accelerator or mixture thereof to the liquid mixture. Preferred agents include dicyandiamide, menthane diamine, N,N,N',N'-tetramethylbutanediamine, and stannous octoate.

Polymerizable mixtures according to the preferred embodiment will typically consist of about 85 weight percent solids, with the remainder attributable to minor solvent content of the ingredients and catalyst. A preferred method of forming polymerized substrates from the liquid mixtures includes the step of curtain coating a base with the liquid prior to polymerization, and I have found that reducing the solids content to about 70 weight percent facilitates this processing step. Where the curtain coating step is used, my preferred solvent is ethylene glycol monomethyl ether (methoxyethanol), such as methyl-Cellosolve.

Forming the initial liquid polymerizable mixture containing from about 45 to about 65 weight percent carboxyl-terminated acrylonitrile butadiene, also having carboxyl groups along its chain length, from about 20 to about 40 weight percent of highly functional epoxy novolac or cycloaliphatic epoxy or a mixture thereof, and from zero to about about 35 weight percent phenolic novolac may be conveniently done at room temperature or with slight warming to facilitate mixing.

The above-described mixtures may be utilized in any number of ways to provide polymeric surfaces for adherent metallization. The entire article may be formed of polymerization products according to the above, or the article to be metal plated may be provided with just a surface coating of such polymers.

If the articles to be metallized are to be provided with a layer of the disclosed polymers, such layers may be applied to a base in many ways. Two basic options include: applying the liquid mixture directly to the base and then precuring the mixture prior to conducting the metal deposition process; and forming thin precured sheets from the liquid mixture for later lamination to the article to be metallized. For example, panel size articles (typically about two square feet in area), including laminates, may be coated with the liquid mixtures by, for example, curtain coating, roller coating or dip coating. The mixtures may then be cured or polymerized by heating, for example via infrared or in a convection oven. Sheet size laminates (typically about twelve square feet in area) are most efficiently provided with a coating of such materials by forming precured sheets of a polymer, for example by coating and precuring the mixture on a release sheet, and then laminating the polymer with a base material.

If polymeric surfaces according to the invention are to form a layer on a base of a different material, fully cured layers of the polymer preferably have a minimum thickness of about 0.75 mil and a maximum thickness of about 1.5 mil, with a preferred thickness of about 1 mil. In contrast with the previously known platable surface coatings, which have low solids-high solvent contents and will provide a final 1 mil-thick coating over about 300-350 square feet of base material per gallon, the low solvent of the instant polymeric coatings permits coverage in the amount of 850-950 square feet of base per gallon per mil.

Diphase polymeric surfaces formed according to the instant invention may be rendered microporous by, e.g., chromic or permanganate treatment, and then seeded according to known procedures to render them catalytic to electroless metal deposition baths. Alternatively, the polymers may include a filler that is autocatalytic to electroless metal deposition baths and the seeding step may be eliminated. See U.S Pat. No. 3,799,758, the disclosure of which is hereby incorporated by reference. If the material is to include a catalytic filler, the preferred catalyst is PEC-8, the formulation of which is disclosed in the referenced patent.

Regarding all of the data below, the test samples were precured for one hour at 160° C. prior to electroless metal processing and postbaked for one hour at 160° C. following adherent metallization.

Unless otherwise noted, as for Tables II and III, infra, all weight percents herein regarding constituents that enter into the resultant polymer are with respect to the basic liquid mixture, i.e., the weights of other ingredients such as catalysts, solvents and the like are not included. With respect to Tables II and III, all weight percents are based upon the total weight of each system given.

Table I sets forth the compositions of the basic liquid mixtures for each of the seven examples described below.

TABLE I

| COMPONENT | EXAMPLE (wt. %) | | | | | | |
|---|---|---|---|---|---|---|---|
| | I | II | III | IV | V | VI | VII |
| carboxylated acrylonitrile butadiene | 60 | 60 | 60 | 60 | 61 | 61 | 45 |
| epoxy novolac | 40 | 40 | 40 | 40 | — | — | 22 |
| cycloaliphatic epoxy | — | — | — | — | 25 | 25 | — |
| phenolic novolac | — | — | — | — | 14 | 14 | 33 |

The examples of Table II illustrate applications of the invention that result in polymeric substrates that may be rendered microporous according to known methods without prior treatment with a strong organic solvent. All component concentrations are in weight percents. Surfaces formed of polymers from mixtures according to Examples I and IV require a seeding step prior to adherent metallization, while polymeric surfaces according to Examples II and III are catalytic to electroless metal deposition without seeding.

TABLE II

| COMPONENT | EXAMPLE | | | |
|---|---|---|---|---|
| | I | II | III | IV |
| carboxylated acrylonitrile butadiene (B.F. Goodrich CTBNX) | 52.3 | 50.8 | 54.2 | 55.7 |
| epoxy novolac (Dow Chemical DEN 431) | 34.8 | 34.0 | 36.1 | 37.1 |
| flow promoter (Raybo 15) | 0.7 | 0.7 | 0.7 | 0.7 |
| catalytic filler (PEC-8) | — | 2.6 | 2.7 | — |
| catalyst (solution A*) | 12.2 | 11.9 | — | — |
| catalyst (solution B**) | — | — | 6.3 | 6.5 |

| *Solution A | | **Solution B | |
|---|---|---|---|
| component | wt. % | component | wt. % |
| dicyandiamide | 11.9 | dicyandiamide | 21.4 |
| dimethylformamide | 66.7 | menthane diamine | 78.6 |
| silicone resin (Dow | 17.8 | | |

TABLE II-continued

| | |
|---|---|
| Corning DC No. 21) | |
| N,N,N',N'-tetramethyl butanediamine | 3.6 |

The examples of Table III are directed to the use of mixtures from which polymers yielding surfaces that should be treated with a strong organic solvent prior to oxidation are derived. Polymers from mixtures according to Examples V and VII yield platable surfaces that require seeding, while surfaces of polymers from mixtures according to Example VI do not require a seeding step prior to adherent metallization. Again, all component concentrations are in weight percent.

TABLE III

| COMPONENT | EXAMPLE | | |
|---|---|---|---|
| | V | VI | VII |
| cycloaliphatic epoxy (Union Carbide ERL 4234) | 24.0 | 23.3 | — |
| carboxylated acrylonitrile butadiene (B F. Goodrich CTBNX) | 60.0 | 58.3 | 44.25 |
| phenolic novolac (Monsanto Chemical P97) | 14.0 | 13.6 | 33.2 |
| epoxy novolac (Dow Chemical DEN 438) | — | — | 22.1 |
| latent catalyst (stannous octoate) | 2.0 | 1.9 | — |
| catalytic filler (PEC-8) | — | 2.9 | — |
| accelerator (N,N,N',N'-tetramethyl benzyldiamine) | — | — | 0.45 |

FIG. 1 is a cured and untouched surface of a heterogeneous polymeric substrate according to the invention. The photomicrograph shows the surface as it appears under a scanning electron microscope and the conditions indicated. FIG. 2 is a photomicrograph of a cured and untouched known surface according to U.S. Pat. No. 3,625,758. The surface was prepared by blending masticated acrylonitrile butadiene rubber prepolymer with an epoxy/phenolic mixture. A comparison of FIGS. 1 and 2 shows that diphase surfaces resulting from processes according to the invention present a more uniform appearance than the previously known heterogeneous surfaces.

FIGS. 3 and 4, at 2000 and 7000 magnification, respectively, show surfaces of the FIG. 1 type following oxidation in chromic solution according to known procedure, while FIG. 5, at 7000 magnification, shows a prior art surface as shown in FIG. 2 following the same chromic treatment. As is evident from comparison of FIGS. 3 and 4 with FIG. 5, diphase surfaces according to the present invention result in a relatively well-ordered, honeycomb-like microporous structure following chromic treatment, while the oxidized diphase surface according to '758 exhibits a much more randomly microroughened and microcracked appearance. The differences are attributable to the fact that surfaces according to the methods here disclosed include a low and narrow-range molecular weight unsaturated component, while the diphase polymer surfaces of '758 have a very large molecular weight distribution of the dispersed phase rubber, because of the chain length and the dispersion being effected physically.

The unsaturated polymer component of mixtures according to the invention and the other components polymerize to yield a dispersed phase rich in polymer having ethylenic unsaturation within a continuous phase or matrix rich in polymer having substantially no ethylenic unsaturation. Because the dispersion is effected by micro phenomena, rather than masticating and blending on a macro scale, the chain length and distribution of the dispersed phase are much more uniform than with previously known heterogeneous surfaces. As indicated by the photomicrographs of the figures, the matrix polymer is much less susceptible than the areas rich in unsaturated polymer to oxidative degradation, resulting in a well-ordered microporosity.

FIGS. 6 and 7 illustrate platable surfaces according to the invention following permanganate treatment of a FIG. 1 type surface, while FIG. 8 illustrates the prior art, FIG. 2 type surface following contacting with a permanganate solution. Again, the honeycomb-like result following oxidative attack of the surfaces of the present invention may be compared to the generally microroughened and microcracked surface resulting from previously preferred heterogeneous surfaces for adherent metallization in electroless metal deposition baths.

Typical micropore diameters following oxidative attack on the polymeric surfaces described range from about 1000 Å to about 45,000 Å, with the majority having diameters in the range of from about 6000 Å to about 18,000 Å. The depth of penetration varies widely up to about 0.3 mil.

Surfaces resulting from polymers formed from the disclosed preferred embodiments typically produce peel strengths on the order of 13 pounds per inch of width following known electroless metal deposition procedures.

Previously known heterogeneous systems for the electroless deposition of metal thereon would exhibit rather sharp attenuation of peel strengths with increased oxidation treatment time, while metallized polymeric surfaces according to the invention yield a relatively flat peel strength response curve: a five minute oxidation treatment yielded a peel strength of about 13 pounds per inch of width and a twenty minute treatment resulted in a peel strength of about 15 pounds per inch of width.

Electrolessly metallized diphase surfaces of the sort disclosed are also remarkably heat resistant. There was no evidence of blistering, even on large areas (1"×3" samples), when articles having metallized polymeric surfaces according to the invention were dip soldered for 20 seconds at 260° C. Repeated application of a soldering iron (up to twelve repetitions) had no blistering effect and evidences an excellent repair capability for such surfaces in printed circuit applications.

Resinous surfaces of the instant invention are widely useful in known electroless metal deposition processes.

For those polymers for which pretreatment prior to activation is suggested, in order to provide polar and strained sites that will be more readily attacked by the oxidizer, contacting with strong organic solvents according to known methods is preferred.

Known oxidizing agents and methods such as chromic, chromic/sulfuric and permanganate treatments may be utilized.

Where a catalytic filler has been incorporated into the polymeric surface in known fashions, no seeding step is required.

If a seeding process is desired, known processes, such as the typical stannous chloride/palladium chloride methods, may be employed.

Plating of the instant resinous surfaces may be achieved with a variety of metals according to known procedures, including, but without limitation, copper (U.S. Pat. No. 3,095,309), nickel (Brenner, Metal Finishing, November 1954, pages 68–76), and gold (U.S. Pat. No. 2,976,181), with regard to which all of the cited references are hereby incorporated by reference.

I claim:

1. A process for electrolessly metal plating an article comprising the steps:
    (a) providing on the surface or portions of the surface of an article to be plated an polymeric layer which is a diphase polymerization product of a liquid mixture comprising (i) from about 45 to about 65 weight percent of a liquid precursor of a solid polymer having ethylenic unsaturation which upon polymerization yields an unsaturated substituted acrylonitrile butadiene rubber susceptible to oxidative degradation and (ii) from about 20 to about 40 weight percent of a highly functional aromatic liquid epoxy resin having substantially no ethylenic unsaturation which upon polymerization yields a thermosetting resin which is relatively impervious to oxidation, said diphase polymerization product having a dispersed phase rich in the polymer having ethylenic unsaturation and a continuous phase rich in the polymer having substantially no ethylenic unsaturation;
    (b) oxidizing said polymeric layer to render said layer microporous; and
    (c) contacting said microporous layer with an electroless metal deposition bath to form a layer of metal thereon.

2. A process as defined in claim 1 wherein after step (b) and before step (c), said microporous layer is seeded to render it catalytic to electroless metal deposition.

3. A process as defined in claim 1 wherein step (a) is carried out by applying the liquid mixture to the surface of said article and then polymerizing said liquid mixture in situ.

4. A process as defined in claim 1 wherein step (a) is carried out by forming a thin, precured sheet of said polymerization product and then laminating said sheet to the surface of said article.

5. A process as defined in claim 1 wherein component (i) is a liquid precursor of a rubber.

6. A process as defined in claim 5 wherein component (i) includes conjugated double bonds.

7. A process as defined in claim 6 wherein component (i) is a liquid carboxyl-terminated acrylonitrile-butadiene.

8. A process as defined in claim 7 wherein said carboxyl-terminated acrylonitrile-butadiene also has carboxyl groups randomly dispersed along the molecular chain.

9. A process as defined in claim 1 wherein prior to electroless metal deposition, said polymeric layer also includes a catalytic filler.

10. A process for electrolessly plating an article comprising the steps:
    (a) providing on the surface or portions of the surface of an article to be plated a polymeric layer which is a diphase polymerization product of a liquid mixture comprising (i) from about 45 to about 65 weight percent of a liquid carboxyl-terminated acrylonitrile-butadiene and (ii) from about 20 to about 40 weight percent of a highly functional liquid epoxylated novolac;
    (b) oxidizing said layer to render said polymeric layer microporous; and (c) contacting said microporous layer with an electroless metal deposition bath to form a layer of metal thereon.

11. A process as defined in claim 10 wherein in step (a), said liquid mixture further includes (iii) a liquid phenolic non-epoxylated novolac.

12. A process as defined in claim 10 wherein said polymeric layer also includes a catalytic filler.

13. A process as defined in claim 10 wherein said carboxyl-terminated acrylonitrile-butadiene also has carboxyl groups randomly dispersed along the molecular chain.

14. A process for electrolessly metal plating an article, including the steps:

(a) providing a surface comprising the polymerization product of a totally liquid mixture comprising
 (1) from about 45 to about 65 weight percent liquid carboxyl-terminated acrylonitrile butadiene, said compound also having carboxyl groups dispersed along the chain length;
 (2) from about 20 to about 40 weight percent of an epoxylated novolac; and
 (3) from zero to about 35 weight percent of a liquid phenolic non-epoxylated novolac, on at least the portion of the article to be electrolessly metal plated;
(b) oxidizing the surface of step (a) to render said surface microporous; and
(c) metallizing at least one area of said microporous surface in an electroless metal deposition bath.

* * * * *